(12) United States Patent
Leipertz et al.

(10) Patent No.: US 6,428,863 B1
(45) Date of Patent: Aug. 6, 2002

(54) SELECTED ADJUSTMENT OF DROPWISE CONDENSATION ON ION IMPLANTED SURFACES

(75) Inventors: Alfred Leipertz, Erlangen; Kyong-Hee Choi, Nürnberg, both of (DE)

(73) Assignee: ESYTEC Energie- und Systemtechnik GmbH, Erlangen (DE)

( * ) Notice: Subject to any disclaimer, the term of this patent is extended or adjusted under 35 U.S.C. 154(b) by 0 days.

(21) Appl. No.: 09/508,538

(22) PCT Filed: Oct. 2, 1998

(86) PCT No.: PCT/EP98/06283

§ 371 (c)(1),
(2), (4) Date: Jun. 5, 2000

(87) PCT Pub. No.: WO99/18252

PCT Pub. Date: Apr. 15, 1999

(30) Foreign Application Priority Data

Oct. 6, 1997 (DE) .......................................... 197 44 080

(51) Int. Cl.⁷ .............................................. C23C 14/18
(52) U.S. Cl. ............ 427/528; 427/255.23; 427/255.315; 427/255.4; 427/287; 427/327; 427/402; 427/435; 427/443.2; 427/533
(58) Field of Search ................... 427/528, 533, 427/255.23, 255.395, 255.4, 287, 327, 402, 435, 443.2

(56) References Cited

PUBLICATIONS

H.D. Baehr et al., Wärme und Stoffübertragung(1993), pp. 416–17. (No month avail.).
G. Koch et al., Condensation of Steam on the Surface of Hard Coated Copper Discs, 32 Heat Mass Transfer 145–56 (1997). (No month avail.).
G. Koch et al., Der Einsatz PTFE–Ähnlicher Hartsoffschichten bei der Tropfenkondesation von Wasserdampf, 32 Chemie Ingenieur Technik 122–25 (1997). (No month avail.).
D.C. Zhang et al., New Surface Materials for Dropwise Condensation, 4 Proc. 8$^{th}$ Int'l Heat Trans. Conf. 1677–82 (1986). (No month avail.).
Q. Zhao et al., Surface Materials with Dropwise Condensation Made by Ion Implantation Technology, 34 Int'l Heat Mass Trans. 2833–35 (1991). (No month avail.).
Q. Zhao et al., Industrial Application of Dropwise Condensation, 4 Proc 9$^{th}$ Int'l Heat Trans. Conf. 391–94 (1990). (No month avail.).
Q. Zhao et al., Dropwise Condensation of Steam on Ion Implanted Condenser Surfaces, 14 Heat Recovery Sys. & CHP 525–34 (1994), (No month avail.).
Q. Zhao et al., Dropwise Condensation of Steam on Ion–Plating Surface, 2 Proc. Int'l Conf. Petroleum Ref. & Petrochem. Processing 1049–52 ( No month avail.).
Q. Zhao et al., Dropwise Condensation of Steam on Vertical and Horizontal U–Type Tube Condensers, Proc. 10$^{th}$ Int'l Heat Trans. Conf., Industrial Session 117–21 (1994). (No month avail.).
Y.J. Song et al., Dropwise Condensation of Steam on Alloy Surfaces Obtained by Ion–Implantation Technique, 8 Gaoxiao Huaxne Gongcheng Xuebao 96–103 (1994). (No month avail.).

*Primary Examiner*—Bernard Pianalto
(74) *Attorney, Agent, or Firm*—Greenblum & Bernstein, P.L.C.

(57) ABSTRACT

Process for selected adjustment of dropwise condensation on a surface comprising implanting nitrogen ions with a theoretically predicted minimum dose concentration of $10^{15}$ cm$^{-2}$, the wetting characteristics of the surface being adjusted without cleaning or other preparation steps in such a way that stable dropwise condensation is formed on the surface and the intensity of condensation and thus heat transfer performance can be selected using the level of the dose concentration.

22 Claims, 4 Drawing Sheets

Drop distance as a function of the pressure difference

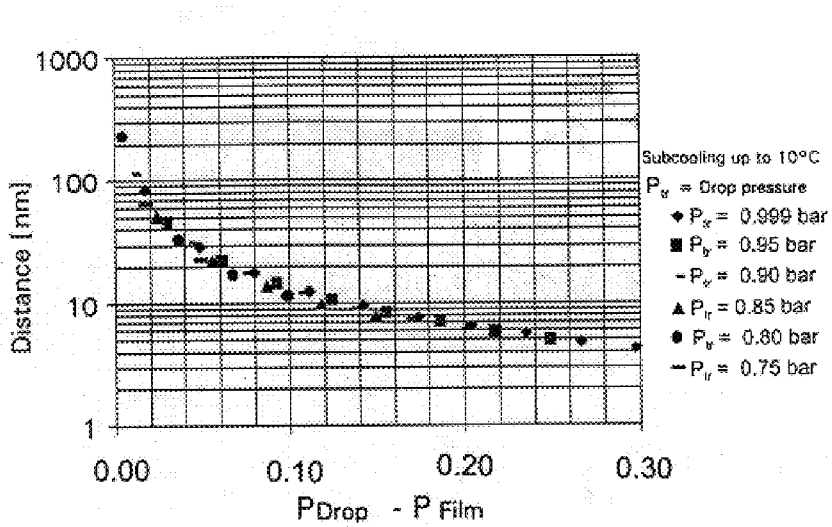
Fig. 1: Drop distance as a function of the pressure difference
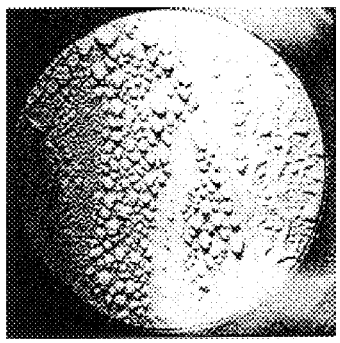 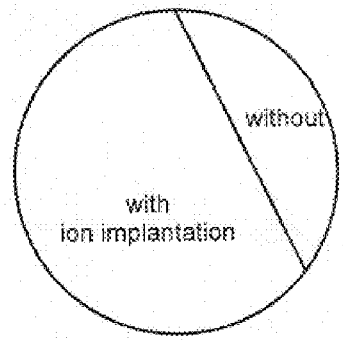
Fig. 2                              Explanation for the photo
Fig. 2: Photo of dropwise condensation
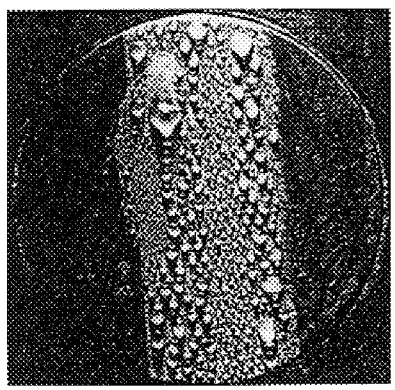 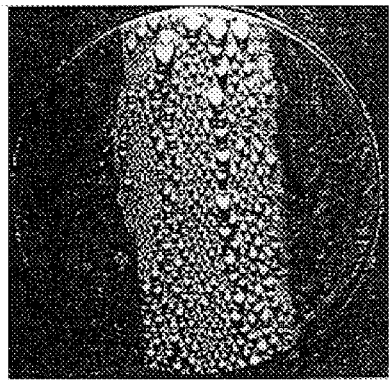
Fig. 3a                              Fig. 3b
Fig. 3: Photos of dropwise condensation on N⁺ implanted copper surfaces after approximately 180 hours operating time

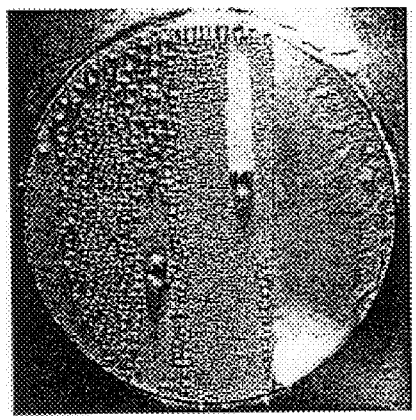
- Ion: B⁺
- Dose: $3 \times 10^{15}$ cm$^{-2}$
- Base material: Copper
Fig. 4:
Realization of dropwise condensation by B⁺ ion implantation on a copper disk.
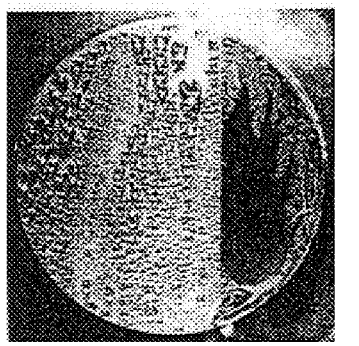 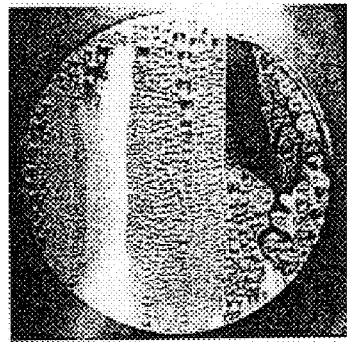 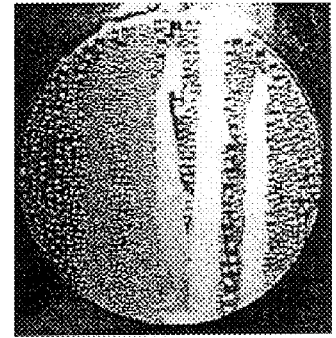
Fig. 5a
(after implantation)
Fig. 5b
(approx. 70 hours after implantation)
Fig. 5c
(approx. 160 hours after implantation)
Fig. 5: Degradation of the dose gradient caused by horizontal diffusion and enlargement of the usable surface for dropwise condensation.

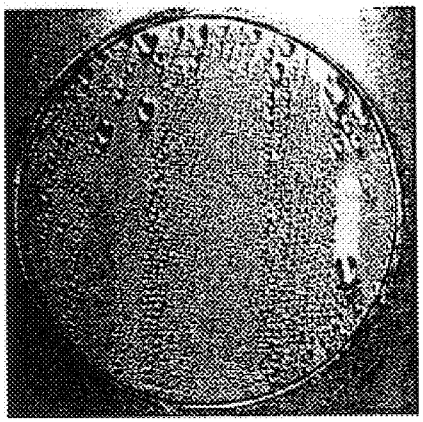

- Dose: $10^{15}$ cm$^{-2}$
- Base material: Copper
- Thickness of chromium layer: 30 μm Fig. 6: Photo of dropwise condensation on a hard-chromium-plated copper disk after 7 weeks of continuous operation.

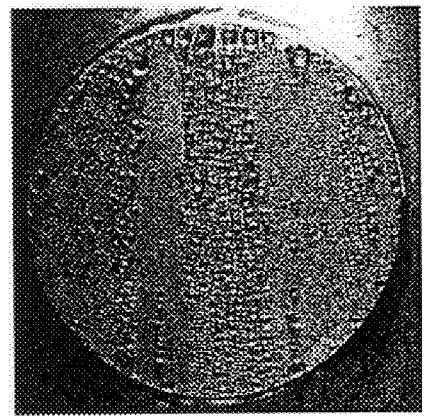

- Dose: $10^{15}$ cm$^{-2}$
- Base material: High-grade steel, X10 Cr Ni Ti 18.9, WST. 4541 (Material number)

Fig. 7: Photo of dropwise condensation on a high-grade steel disk after 9 weeks of continuous operation.

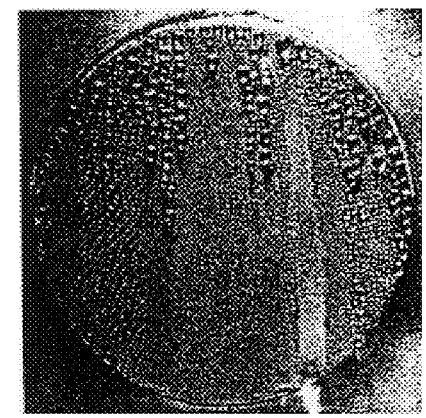

- Dose: $10^{15}$ cm$^{-2}$
- Base material: Titanium

Fig. 8: Photo of dropwise condensation on a titanium disk after 2 weeks of continuous operation.

- Dose: $10^{16}$ cm$^{-2}$
- Base material: Copper
- Thickness of the chemically nickel-plated layer. 30μm Realization of dropwise condensation by N$^+$ ion implantation on a chemically nickel-plated copper disk.

- Dose: $10^{16}$ cm$^{-2}$
- Base material: Aluminum (AlCuMgPb F38)

Realization of dropwise condensation by N$^+$ ion implantation on an aluminum disk.

SELECTED ADJUSTMENT OF DROPWISE CONDENSATION ON ION IMPLANTED SURFACES

FIELD OF THE INVENTION

The present invention relates to condensation on surfaces. More specifically, the invention relates to implantation of ions on a surface to adjust its wetting characteristics, e.g., adjustment of dropwise condensation.

BACKGROUND OF THE INVENTION

If pure vapor touches a solid wall surface whose temperature is below the saturation temperature of the vapor, the vapor condenses on this surface as a liquid. The condensation process can be carried out in two different forms, as film condensation or as dropwise condensation. In the case of film condensation, the wall surface is completely wetted by the condensate, forming a connected condensate film. In contrast to film condensation, the condensate does not wet the wall completely in dropwise condensation; the condensate forms independent drops. The wettability of the surface is responsible for the formation of each type of condensation and has a very strong effect on the performance of a possible heat transfer process. Thus, a heat transfer coefficient of four to ten times larger has been measured for dropwise condensation of water vapor [1–3], which constitutes its great technological importance.

Although conditions for promoting dropwise condensation have been known in principle for several decades and experiments with coatings as promoters have been carried out successfully at least in part, the application of dropwise condensation is still in a testing phase. The main problems for the realization of dropwise condensation are that the working boundary surface phenomena such as complete or incomplete wettability are insufficiently theoretically described and strongly depend on influences caused in the practical operation by contamination, oxidation of the surface, adsorption layers, and gas enclosures. Additionally, surface defects (roughness) and chemical pollutants cause the frequently observed hysteresis of the wetting angle, which has an unfavorable effect on heat transfer.

Ion plantation or ion implantation of N, Ar, He, H, Cr, Fe, and Al in copper tubes was successfully used to achieve dropwise condensation by Zhang, Zhao et al. [4–6], but the experiments with Sb, Sn, In, Se, and Bi failed. Later on, $F^+$ and $C^+$ (produced from Teflon irradiation), along with $Cr^+$ or $Cr^+$ alone, were implanted on PTFE coated surfaces [7]. The method of the simultaneous plantation or implantation of $Cr^+$ with other ions was tested with $N^+$ and also with $CH_4$ [8] and $C_2H_6$ [9], with different alloys being produced in each case. For all these methods, it is typical and thus is attributed to the particular methods that

- these alloys can only be produced by several somewhat complex manufacturing steps connected in series, as described in great detail by Zhao and Burnside [7]. These processes consist of work steps for the removal of pollutants and oxides, surface cleaning by sputtering with $Ar^+$, $N^+$, $P^+$ and/or $Cr^+$ and $N^+$ simultaneously, and subsequent plantation and/or implantation steps;
- high energy doses of approximately 100 keV [7] with dose concentrations of $>10^{17}$ $cm^{-2}$ are needed for the sputtering and ion implantation processes (with the exception of the first attempts with ion plantation [4] which, however, represents only a surface coating, and not an ion implantation, with an alloy formation due to heat influences;
- alloys of different types are produced, partly consecutively, with a total layer structure thickness of up to 5 $\mu m$;
- the dopant elements and the dosages that can be used were selected in a purely empirical manner without any theoretical basis, and which solely state with regard to dosing that a high dose improves the tendency of drop formation [10].

SUMMARY OF THE INVENTION

With this invention, a method is introduced and presented that is a substantial simplification of the methods described thus far and which allows, e.g., by means of the use of technologically established metallic base materials, a low-cost production of heat transfer systems having suitable surfaces that are usable on a large-scale in which selection of dopant elements and the necessary dose concentration can be determined theoretically.

The process of dropwise condensation is adjustable in a temporally and locally stable manner by providing a chemical potential which works with the same magnitude against the chemical potential being generated during drop formation. This new method allows the identification of the necessary dose concentration and the suitable type of dopant elements for ion implantation of surfaces used for selected adjustment of dropwise condensation.

Thus, according to the present invention:

- formation of oxides before actual ion implantation process is favorably permitted and thus ion implantation is executed directly without any cleaning processes beforehand and without pre-sputtering;
- in a large process window with a broadband ion source, basically the simplest manageable element, nitrogen, is used for ion implantation, with the use of mixed ions ($N_2^+$, $N^+$, $N^{++}$) providing the necessary ion concentration and accelerating the process (by a factor of 10);
- an ion concentration of $10^{15}$ $cm^{-2}$ (based on theoretical considerations) is regarded as basically sufficient, which allows a small irradiation energy and thus produces no additional surface layers, leading to more favorable boundary conditions for the heat transfer. A minimum dose concentration of $10^{15}$ $cm^{-2}$ results from calculation of the distances of dopant elements for the adjustment of dropwise condensation. By increasing this dose concentration, the intensity of dropwise condensation, and thus the level of the heat transfer performance, is directly increased;
- further simplifying the process, often only a limited part of the surface is ion implanted, forming afterwards a surface area that is completely useable for dropwise condensation by balancing out the dose concentration gradient by horizontal diffusion inside the base material along the surface,
- directed to different areas of application, favorably different base materials can be used for ion implantation, resulting in fairly substantial advantages in costs or process execution, e.g., hard-chromium-plated copper, chemically nickel-plated copper; or rust-proof metals; such as high-grade steel; aluminum; or titanium;
- the intensity of dropwise condensation can be adjusted by selection of dopant elements on the basis of theoretical considerations using the ratio of the dipole moments of the dopant elements with that of nitrogen.

BRIEF DESCRIPTION OF THE DRAWINGS

FIG. 1 shows calculated dopant element distances as a function of pressure difference between drop pressure and film pressure;

FIG. 2 is a photograph of dropwise condensation in a laboratory condenser;

FIGS. 3a–3b are photographs of dropwise condensation on $N^+$-implanted copper surfaces;

FIG. 4 is a photograph of dropwise condensation by $B^+$ ion implantation on a copper disk;

FIGS. 5a, 5b and 5c are photographs showing degradation of the dose gradient caused by horizontal diffusion and enlargement of the useable surface for dropwise condensation;

FIG. 6 is a photograph of dropwise condensation on a hard-chromium-plated copper disk;

FIG. 7 is a photograph of dropwise condensation on a high-grade steel disk;

FIG. 8 is a photograph of dropwise condensation on a titanium disk;

DETAILED DESCRIPTION OF THE INVENTION

Figure 9:
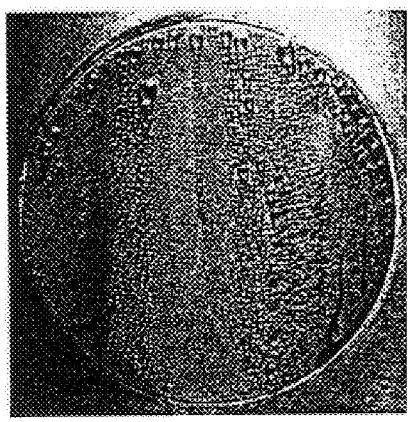
FIG. 9 is a photograph of dropwise condensation by $N^+$ ion implantation on a chemically nickel-plated copper disk.

The individual characteristics of the method are described precisely in the following as far as additionally necessary. First, the theoretical considerations are presented by which the necessary minimum dose concentration can be calculated and by which the dopant elements can be selected. Based on thermodynamic fundamentals for the irreversible process of condensation, it can be shown via the value of the chemical potential that, for realization of dropwise condensation, a chemical potential $\Delta\mu$ must be found and used which, with the same value, works against the chemical potential $\Delta\mu_{TRB}$ occurring during drop formation and thus makes it possible to achieve the minimum value of the chemical potential necessary for stability of dropwise condensation. In ion implantation, this is possible by forming a dipolar momentum in the base material by which, by the attraction energy between, e.g., water and mostly metallic surfaces utilized in dropwise condensation, an appropriate chemical potential is constructed and supplied.

A drop can exist if drops and vapor are in thermodynamic equilibrium: $\mu_{drop}=\mu_{steam}$. With the assumption that vapor behaves like an ideal gas, the vapor pressure is dependent upon the radius of the drop and from this the drop radius r can be calculated using equation (1)

$$r = \frac{2 \cdot V_m \cdot \gamma}{R \cdot T_{Tr} \cdot \ln\frac{P_{Tr,D}}{P^*}} \quad (1)$$

wherein $V_m$=drop molar volume, $\gamma$=surface tension, R=gas constant $T_{Tr}$=drop temperature, $P_{Tr,D}$=drop vapor pressure, and $P^*$=vapor pressure of a liquid for a flat surface.

In order to stabilize the condensation process, the drop vapor pressure must always be less than the pressure of a condensing vapor $P_D$. This is because condensation is a mass transfer process caused by the concentration and/or pressure gradient $$(P_D - P_{Tr,D}) > 0.$$

The material values $\gamma$, $\rho$ and $P^*$ in equation (1) are dependent on $T_{Tr}$, so that these values can be expressed as a function of $T_{Tr}$ (according to the VDI-Wärmeatlas) as shown in equation (2)

$$\gamma = -0.2 \cdot T_{Tr}(°C.) + 78 \quad (2a)$$

$$\rho = -0.7 \cdot T_{Tr}(°C.) + 1028 \quad (2b)$$

$$P^* = 0.03 \cdot T_{Tr}(°C.) - 2 \quad (2c)$$

The equations (2) result from a linear interpolation for water between 90° C. and 100° C.

Introducing this into equation (1), the drop radius r is given depending only on $T_{Tr}$ by equation (3):

$$r = \frac{2 \cdot \tilde{M} \cdot (-0.2 \cdot T_{Tr}(°C.) + 78)}{R \cdot T_{Tr}(K) \cdot (-0.7 \cdot T_{Tr}(°C.) + 1028) \cdot \ln\frac{P_{Tr,D}}{0.03 \cdot T_{Tr}(°C.) - 2}} \quad (3)$$

The distances of the dopant elements L (L=2r) were calculated from equation (3) with $P_D$=1 bar for subcooling of the condensate ($\Delta T_{Unt}=T_D-T_{tr}$) up to 10° C. and the change of the drop pressure from 0.75 bar to 0.999 bar. In equation (3), $\tilde{M}$ is molar volume; C is Celsius; and K is Kelvin. The results are shown in FIG. 1 as a function of the pressure difference between drop pressure and film pressure.

FIG. 1 displays the range of the droplet sizes at the beginning of condensation. The drop radii are very small, with a smallest value of 2 nm. The length of 1 nm is approximately the sum of 40 molecular diameters. The smallest dopant element distance L (=2·r) therefore corresponds to about 160 molecular distances. In order for all dopant elements to always have the same distances, they must form a triangle. In this triangle, therefore, 12,800 elements are present. Thus, the dopant density is 0.023% of all present elements.

This result has been experimentally verified. Since the distances of the dopant elements depend on subcooling, the experiment was executed with different ion doses (number of ions per area). A distance of 1.0 nm corresponds to a dose of $1.0 \times 10^{15}/cm^2$. In the first experiments, double ionized nitrogen ($N^{++}$) was implanted in a copper disk with a diameter of 60 mm and a thickness of 10 mm with a surface roughness of <1 $\mu$m. With differently selected dopant densities ($1.4 \times 10^{10} - 1.0 \times 10^{15}$ cm$^{-2}$), it could be shown that only the highest dose actually leads to dropwise condensation. In FIG. 2, an example is shown photographically that was taken in a laboratory condenser at the LTT-Erlangen. In order to achieve dropwise condensation, the dopant dose concentration must be greater than $1.0 \times 10^{15}$ cm$^{-2}$.

As shown by this, double positively charged nitrogen ($N^{++}$) is suitable as a dopant element for ion implantation. Experiments with single positively charged nitrogen ($N^+$) with an equal dose concentration lead to even better results with a distinctly more favorable tendency for long-term durability (in this case, >180 hours of operation time). In FIG. 3, photos of dropwise condensation with $N^+$-doping are displayed (only the central part has been ion implanted).

By initial attempts on a purely "testing" basis without any theoretical background, Zhang, Zhao et al. [4–6] found for plantation or implantation of a copper tube that, besides the gaseous test elements (N, He, Ar, H), elements only Cr, Fe, and Al, but not Sb, Sn, In and Bi, could be verified for dropwise condensation. There was no attempt to explain this in the literature. Recently, however, the inventors have found such an explanation on the basis of a dipole moment formation in the metallic surfaces due to ion implantation. As explained above, the function of the implantation is to act against increase of the chemical potential $\Delta\mu_{TRB}=f(r)$ that is a function of drop radius r on the basis of drop formation. This could be achieved by an attraction force W formed by the dipole moment θ and the atomic radius of the doping elements $r_A$ (W=$\Delta\mu$=f(θ,$r_A$)). The suitable dipole moment can be identified from the equality of both chemical potentials which cannot be explained in much detail here and which so far has only been accomplished in the form of a rough estimation. With reference to the dipole moment $\theta_N$ formed with nitrogen, the condition for the formation of dropwise condensation is given in that the ratio between the dipole moment of the dopant elements I$\theta_i$ and $\theta_N$ must be less than or equal to one:

$$\theta_i/\theta_N \leq 1. \quad (4)$$

This leads to a suitable atomic radius of $r_A \leq 63.3$ pm. In Table 1, data ($\theta_i/\theta_N$ and $r_A$) are given for dopant elements which have been tested by Zhang, Zhao et al. [4–6]. From this, it is possible to recognize that, with the aid of the developed criterion, a correct forecast for adjustment of dropwise condensation is possible as a measure for an incomplete wettability of the surface, which proves the validity of this invention.

TABLE 1

Atomic radius and nitrogen-referred dipole moment ratios for different dopant elements (n = number of neighboring atoms)

| Element i | Radius [m] | n | $\theta_i/\theta_N$ |
|---|---|---|---|
| N | 6.50E−11 | — | 1 |
| Cr | 6.10E−11 | — | 0.92 |
| Fe | 6.30E−11 | — | 0.96 |
| Al | 3.90E−11 | 4 | 0.54 |
| Al | 5.30E−11 | 6 | 0.76 |
| Sb | 2.20E−10 | — | 9.46 |
| Se | 2.00E−10 | — | 7.66 |
| Sn | 6.90E−08 | 6 | 1.09 |
| In | 7.90E−11 | 6 | 1.33 |
| In | 9.20E−11 | 8 | 1.7 |

Based upon the criterion of equation (4), further dopant elements could be identified for the achievement of dropwise condensation, which have not been completely proven experimentally so far, but are named here as part of this invention. These are, e.g., the ions of Li, Be, B, Mg, Ga, Ti, and Co. This list can be expanded accordingly with known data.

However, this has already been proven experimentally for B$^+$, see FIG. 4 (here, the dose is again only $10^{15}$ cm$^{-2}$).

To simplify the production process, often only a limited part of the surfaces to be used later for dropwise condensation are implanted with ions. By diffusion, the entire surface becomes usable for dropwise condensation within a few hours after implantation (FIG. 5). This means that, for the production process, the degree of homogeneity can be set low for the production of the surface alloy, enabling a further reduction in the manufacturing time. This has been verified for essential base materials that have been tested successfully so far.

Figure 10:
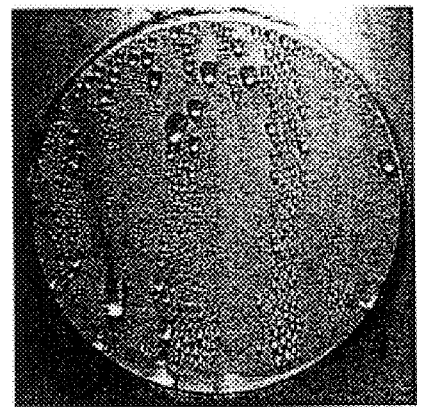
FIG. 10 is a photograph of dropwise condensation by $N^+$ ion implantation on an aluminum disk.

The selection of the base material is often dependent upon the different applications (e.g., titanium and/or high-grade steel for the chemical industry, copper for brewery operations, aluminum for weight sensitive applications, etc.). For simpler N$^+$ implantation, again without any previous cleaning or sputtering procedure, this was successfully executed for the first time with the calculated minimum dose concentration of $10^{15}$ cm$^{-2}$ not only on pure copper, but also on hard-chromium-plated copper (FIG. 6), high-grade steel (FIG. 7), and titanium (FIG. 8), and with an increased dose concentration of $10^{16}$ cm$^{-2}$ on chemically nickel-plated copper (FIG. 9), and also aluminum (FIG. 10).

REFERENCES

[1] Baehr, H. D., Stephan, K. Wärme- und Stoffübertragung Springer-Verlag, Berlin-Heidelberg (1993)
[2] Koch, G., Zhang, D. C., Leipertz, A. Condensation of steam on the surface of hard coated copper discs Heat Mass Transfer 32, 149–156 (1996)
[3] Koch, G., Leipertz, A. Der Einsatz PTFE-ähnlicher Hartstoffschichten bei der Tropfenkondensation von Wasserdampf Chemie-Ingenieur-Technik 32, 122–125 (1996)
[4] Zhang, D. C., Lin, Z. Q., Lin, J. F. New surface materials for dropwise condensation Proc. VIIIth Heat Transfer Conf. 4, 1677–1682 (1986)
[5] Zhao, Q., Zhang, D. C., Lin, J. F. Surface materials with dropwise condensation made by ion implantation technology Int. J. Heat Mass Transfer 34, 2833–2835 (1991)
[6] Zhao, Q., Zhang, D. C., Zhu, X. B., Xu, D. Q., Lin, Z. Q., Lin, J. F. Industrial application of dropwise condensation Proc. IXth Int. Heat Transfer Conf., Vol. 4, 391–394 (1990)
[7] Zhao, Q., Burnside, B. M. Dropwise condensation of steam on ion implanted condenser surfaces Heat Recovery Systems & CHP, September 1994, Vol.14, No.5, pp.525–534
[8] Zhao, Q., Zhang, D. C., Li, S. D., Xu, D. Q., Lin, J. F. Dropwise condensation of steam on ion plated surface Proc. of International Conference on Petroleum Refining and Petrochemical Processing, Vol.2, pp.1049–1052 (1991)
[9] Zhao, Q., Liu, J. J., Bai, T., Lin, J. F., Cui, B. Y., Shen, J. L., Fang, N. F. Dropwise condensation of steam on vertical and horizontal U-type tube condensers Proc. 10th Heat Transfer Conference, Industrial Session, pp.117–121 (1994)
[10] Song, Y. J., Ren, X. G. Dropwise condensation of steam on alloy surfaces obtained by ion-implantation technique Gaoxiao Huaxne Gongcheng Xuebao, Vol.8, 96–103 (1994)

What is claimed is:

1. A process for selected adjustment of dropwise condensation on a surface comprising implanting nitrogen ions with a theoretically predicted minimum dose concentration of $10^{15}$ cm$^{-2}$ to adjust the wetting characteristic of the surface without need for cleaning or other preparation steps such that stable dropwise condensation is formed on the surface and the intensity of the condensation and heat transfer performance can be selected using the size of the dose concentration, and further comprising calculating the minimum dose from a calculated distance of doping elements (L=2r) according to the following formula:

$$r = \frac{2 \cdot \tilde{M} \cdot (-0.2 \cdot T_{Tr}(° \text{C.}) + 78)}{R \cdot T_{Tr}(K) \cdot (-0.7 \cdot T_{Tr}(° \text{C.}) + 1028) \cdot \ln \frac{P_{Tr,D}}{0.03 \cdot T_{Tr}(° \text{C.}) - 2}}$$

wherein r is the drop radius, $\tilde{M}$ is the molar volume, $T_{tr}$ is the drop temperature, and $P_{tr,D}$ is the drop vapor pressure.

2. The process of claim 1, wherein the ion implantation process is conducted in an accelerated manner by a factor of 10 by the production and use of mixed ions.

3. A method of utilizing ion implanted surface(s) manufactured by the process of claim 2 in condensers.

4. The process of claim 1, wherein the surface comprises a material selected from copper, hard-chromium-plated copper, chemically nickel-plated copper, or rust-proof metals such as high-grade steel, aluminum, and titanium.

5. A method of utilizing ion implanted surface(s) manufactured by the process of claim 4 in condensers.

6. A method of utilizing ion implanted surfaces manufactured using the process of claim 1 in condensers.

7. The process of claim 1, wherein only one part of the surface is ion implanted.

8. The process of claim 7, wherein the surface comprises a material selected from copper, hard-chromium-plated copper, chemically nickel-plated copper, or rust-proof metals such as high-grade steel, aluminum, and titanium.

9. A method of utilizing ion implanted surface(s) manufactured by the process of claim 7 in condensers.

10. A method of identifying the dopant elements, besides nitrogen, for the process of claim 1, comprising selecting a dopant having a dipole moment of same value or smaller as compared with the dipole moment of nitrogen.

11. A method of utilizing ion implanted surface(s) manufactured by the process of claim 10 in condensers.

12. A process of selected adjustment of dropwise condensation on a surface of a base material, without need for cleaning, pre-sputtering or other preparation, comprising: modifying the surface by implanting dopant ions of a material having a dipole moment equal to or less than the dipole moment of nitrogen on the surface to a theoretically calculated dose concentration of at least $10^{15}$ cm$^{-2}$, to provide for forming stable dropwise condensation on the surface, wherein the intensity of the condensation and heat transfer performance is dependent on the dose concentration, and further comprising calculating the minimum dose from a calculated distance of doping elements (L=2r) according to the following formula:

$$r = \frac{2 \cdot \tilde{M} \cdot (-0.2 \cdot T_{Tr}(° \text{C.}) + 78)}{R \cdot T_{Tr}(K) \cdot (-0.7 \cdot T_{Tr}(° \text{C.}) + 1028) \cdot \ln \frac{P_{Tr,D}}{0.03 \cdot T_{Tr}(° \text{C.}) - 2}}$$

wherein r is the drop radius, $\tilde{M}$ is the molar volume, $T_{tr}$ is the drop temperature, and $P_{tr,D}$ is the drop vapor pressure.

13. A method of utilizing ion implanted surface(s) made according to claim 12 in a condenser.

14. A process of selected adjustment of dropwise condensation on a surface of a base material comprising: modifying the surface by implanting nitrogen dopant ions on the surface to a theoretically calculated dose concentration of at least $10^{15}$ cm$^{-2}$, to provide for stable dropwise condensation on the surface, wherein the intensity of the condensation and heat transfer performance is dependent on the dose concentration, and further comprising calculating the minimum dose from a calculated distance of doping elements (L=2r) according to the following formula:

$$r = \frac{2 \cdot \tilde{M} \cdot (-0.2 \cdot T_{Tr}(° \text{C.}) + 78)}{R \cdot T_{Tr}(K) \cdot (-0.7 \cdot T_{Tr}(° \text{C.}) + 1028) \cdot \ln \frac{P_{Tr,D}}{0.03 \cdot T_{Tr}(° \text{C.}) - 2}}$$

wherein r is the drop radius, $\tilde{M}$ is the molar volume, $T_{tr}$ is the drop temperature, and $P_{tr,D}$ is the drop vapor pressure.

15. A process of utilizing in a condenser an ion implanted surface according to claim 14.

16. The process of claim 14, wherein the dopant comprises mixed ions.

17. The process of claim 16, wherein the mixed ions comprise $N_2$, $N^+$, and $N^{++}$.

18. The process of claim 16, wherein the mixed ions accelerate the duration of the process by a factor of 10.

19. The process of claim 14, wherein only a part of the surface is ion implanted.

20. The process of claim 14, wherein the base material is selected from copper, hard-chromium-plated copper, chemically nickel-plated copper, rust-proof steel, aluminum, and titanium.

21. A method of utilizing ion implanted surface(s) made according to claim 20 in a condenser.

22. The process of claim 20, wherein the minimum dose concentration is $10^{16}$ cm$^{-2}$.

* * * * *